United States Patent
Xie et al.

(10) Patent No.: US 11,295,988 B2
(45) Date of Patent: Apr. 5, 2022

(54) SEMICONDUCTOR FET DEVICE WITH BOTTOM ISOLATION AND HIGH-κ FIRST

(71) Applicant: International Business Machines Corporation, Armonk, NY (US)

(72) Inventors: Ruilong Xie, Niskayuna, NY (US);
Julien Frougier, Albany, NY (US);
Jingyun Zhang, Albany, NY (US);
Alexander Reznicek, Troy, NY (US);
Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/899,430

(22) Filed: Jun. 11, 2020

(65) Prior Publication Data

US 2021/0391222 A1    Dec. 16, 2021

(51) Int. Cl.
*H01L 21/8238*    (2006.01)
*H01L 27/092*    (2006.01)
(Continued)

(52) U.S. Cl.
CPC .......... *H01L 21/823807* (2013.01); *H01L 21/02532* (2013.01); *H01L 21/02592* (2013.01); *H01L 21/02603* (2013.01); *H01L 21/28088* (2013.01); *H01L 21/823814* (2013.01); *H01L 21/823842* (2013.01); *H01L 21/823864* (2013.01);
(Continued)

(58) Field of Classification Search
CPC ....... H01L 21/823807; H01L 21/02532; H01L 21/02592; H01L 21/02603; H01L 21/28088; H01L 21/823814; H01L 21/823842; H01L 21/823864; H01L 21/823878; H01L 27/092; H01L 29/0649; H01L 29/0673; H01L 29/42392; H01L 29/4908; H01L 29/4966; H01L 29/66545;
(Continued)

(56) References Cited

U.S. PATENT DOCUMENTS 7,868,363 B2    1/2011    Zundel et al.
8,598,669 B2    12/2013    Hikida
(Continued)

FOREIGN PATENT DOCUMENTS

CN    104637814 A    5/2015
CN    109285838 A    1/2019

OTHER PUBLICATIONS

P. Weckx et al., "Stacked nanosheet fork architecture for SRAM design and device co-optimization toward 3nm," 2017 IEEE International Electron Devices Meeting (IEDM) (Dec. 2017) (4 pages).

*Primary Examiner* — Tong-Ho Kim
(74) *Attorney, Agent, or Firm* — Robert Sullivan; Michael J. Chang, LLC

(57) ABSTRACT

Semiconductor FET devices with bottom dielectric isolation and high-κ first are provided. In one aspect, a semiconductor FET device includes: a substrate; at least one device stack including active layers oriented horizontally one on top of another on the substrate; source and drains alongside the active layers; and gates, offset from the source and drains by inner spacers, surrounding a portion of each of the active layers, wherein the gates include a gate dielectric that wraps around the active layers but is absent from sidewalls of the inner spacers. A method of forming a semiconductor FET device is also provided.

20 Claims, 17 Drawing Sheets

(51) Int. Cl.
*H01L 29/06* (2006.01)
*H01L 29/423* (2006.01)
*H01L 29/49* (2006.01)
*H01L 29/786* (2006.01)
*H01L 21/02* (2006.01)
*H01L 21/28* (2006.01)
*H01L 29/66* (2006.01)

(52) U.S. Cl.
CPC .... *H01L 21/823878* (2013.01); *H01L 27/092* (2013.01); *H01L 29/0649* (2013.01); *H01L 29/0673* (2013.01); *H01L 29/42392* (2013.01); *H01L 29/4908* (2013.01); *H01L 29/4966* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ......... H01L 29/66553; H01L 29/66742; H01L 29/78618; H01L 29/78696
USPC ........................................... 257/351
See application file for complete search history.

(56) References Cited

U.S. PATENT DOCUMENTS

| | | |
|---|---|---|
| 8,872,344 B2 | 10/2014 | Mair |
| 8,926,933 B2 | 1/2015 | Zhang et al. |
| 9,053,803 B2 | 6/2015 | Hu et al. |
| 9,653,289 B1* | 5/2017 | Balakrishnan ...... H01L 29/4983 |
| 9,815,056 B2 | 11/2017 | Wu et al. |
| 9,941,276 B2 | 4/2018 | Zundel et al. |
| 10,038,096 B2 | 7/2018 | Zang et al. |
| 10,096,708 B2 | 10/2018 | Athanasiou et al. |
| 10,263,100 B1* | 4/2019 | Bi .................. B82Y 10/00 |
| 10,367,068 B2 | 7/2019 | Athanasiou et al. |
| 2014/0312393 A1 | 10/2014 | Rodder et al. |
| 2016/0190247 A1* | 6/2016 | Frank ............... H01L 29/66545 |
| | | 438/151 |
| 2018/0342596 A1* | 11/2018 | Lee ................ H01L 29/165 |
| 2019/0115280 A1 | 4/2019 | Zhou |
| 2019/0237559 A1* | 8/2019 | Cheng ............. B82Y 10/00 |
| 2020/0052107 A1* | 2/2020 | Lie .................. H01L 27/088 |
| 2020/0105762 A1* | 4/2020 | Xiao ................ H01L 21/8238 |

* cited by examiner

US 11,295,988 B2

SEMICONDUCTOR FET DEVICE WITH BOTTOM ISOLATION AND HIGH-κ FIRST

FIELD OF THE INVENTION

The present invention relates to semiconductor field-effect transistor (FET) devices, and more particularly, to semiconductor FET devices with bottom dielectric isolation and high-κ first.

BACKGROUND OF THE INVENTION

Fork nanosheet field-effect transistor (FET) devices offer further scaling opportunities over traditional finFET and nanosheet architectures. With a fork nanosheet device, spacing between the n-channel FET (NFET) and p-channel FET (PFET) devices is reduced to permit further area scaling.

The implementation of a fork nanosheet FET design, however, can present some notable fabrication challenges. For instance, during conventional fabrication process flows, high temperature processing can cause the unwanted diffusion of other elements into the nanosheet channels leading to poor interface quality and/or degraded electron mobility.

Also, in nanosheet technology, bottom dielectric isolation is important to suppress leakage and to reduce parasitic capacitance. Formation of the bottom dielectric isolation can be accomplished by selectively removing the bottom-most nanosheet and replacing it with dielectric layer. However, with conventional fabrication process flows oxidation of the bottom nanosheet that occurs during the process flow can make its subsequent removal difficult.

Therefore, improved techniques for forming nanosheet devices would be desirable.

SUMMARY OF THE INVENTION

The present invention provides semiconductor field-effect transistor (FET) devices with bottom dielectric isolation and high-κ first. In one aspect of the invention, a semiconductor FET device is provided. The semiconductor FET device includes: a substrate; at least one device stack including active layers oriented horizontally one on top of another on the substrate; source and drains alongside the active layers; and gates, offset from the source and drains by inner spacers, surrounding a portion of each of the active layers, wherein the gates include a gate dielectric that wraps around the active layers but is absent from sidewalls of the inner spacers.

In another aspect of the invention, another semiconductor FET device is provided. The semiconductor FET device includes: a substrate; a p-channel FET (PFET) device stack separated from an n-channel (NFET) device stack by an NFET-to-PFET spacer, wherein the PFET device stack and the NFET device stack each includes active layers oriented horizontally one on top of another on the substrate; source and drains alongside the active layers; and gates, offset from the source and drains by inner spacers, surrounding a portion of each of the active layers, wherein the gates include a gate dielectric that wraps around the active layers but is absent from sidewalls of the inner spacers, and at least one work-function-setting metal disposed on the gate dielectric.

In yet another aspect of the invention, a method of forming a semiconductor FET device is provided. The method includes: forming at least one device stack on a substrate including a first sacrificial layer and alternating layers of second sacrificial layers and active layers disposed on the first sacrificial layer; removing the first sacrificial layer and replacing the first sacrificial layer with a dielectric material to form a bottom dielectric isolation layer; selectively removing the second sacrificial layers forming gaps in the at least one device stack between the active layers; depositing a gate dielectric into the gaps that wraps around the active layers; depositing a sacrificial material into the gaps over the gate dielectric; forming sacrificial gates and dielectric spacers over the at least one device stack; forming trenches in the at least one device stack using the sacrificial gates and the dielectric spacers; indenting the sacrificial material to form pockets along sidewalls of the trenches; and forming inner spacers within the pockets, wherein the gate dielectric is absent from sidewalls of the inner spacers.

A more complete understanding of the present invention, as well as further features and advantages of the present invention, will be obtained by reference to the following detailed description and drawings.

DETAILED DESCRIPTION OF PREFERRED EMBODIMENTS

As provided above, the implementation of a nanosheet field-effect transistor or a fork nanosheet field-effect transistor (FET) design can present some notable fabrication challenges. For instance, in nanosheet technology sacrificial silicon germanium (SiGe) nanosheets are often employed between silicon (Si) channels. However, conventional fabrication flows involve high-temperature processing which can cause the diffusion of germanium (Ge) from the sacrificial layers into the Si channels, leading to poor interface quality and/or degraded electron mobility.

Sacrificial nanosheets such as high Ge content SiGe can also be implemented in the formation of the bottom dielectric isolation layer beneath the nanosheets to suppress leakage and reduce parasitic capacitance. However, with conventional fabrication flows, upstream processes such as shallow trench isolation (STI) processing can cause oxidation of the sacrificial nanosheets, making their selective removal increasingly difficult. Namely, if the SiGe sacrificial nanosheets are oxidized, then the oxide has to be removed before removing the SiGe. However, after gate patterning it is not advisable to apply an extensive isotropic oxide etch because that can also damage the gate hardmask, as well as the STI.

Advantageously, the present techniques provide fork nanosheet FET designs and methods for fabrication thereof that avoid the above-described problems altogether. For instance, as will be described in detail below, with the present techniques the bottom dielectric isolation layer is formed prior to the STI module. As such, any problems associated with the undesirable oxidation of the high Ge content SiGe sacrificial nanosheets are avoided altogether, and these sacrificial nanosheets can be easily removed. Also, the thermal budget is low through removal of the sacrificial nanosheets selective to the channels. Thus, any problems associated with diffusion of Ge into the channels are avoided altogether.

Figure 1:
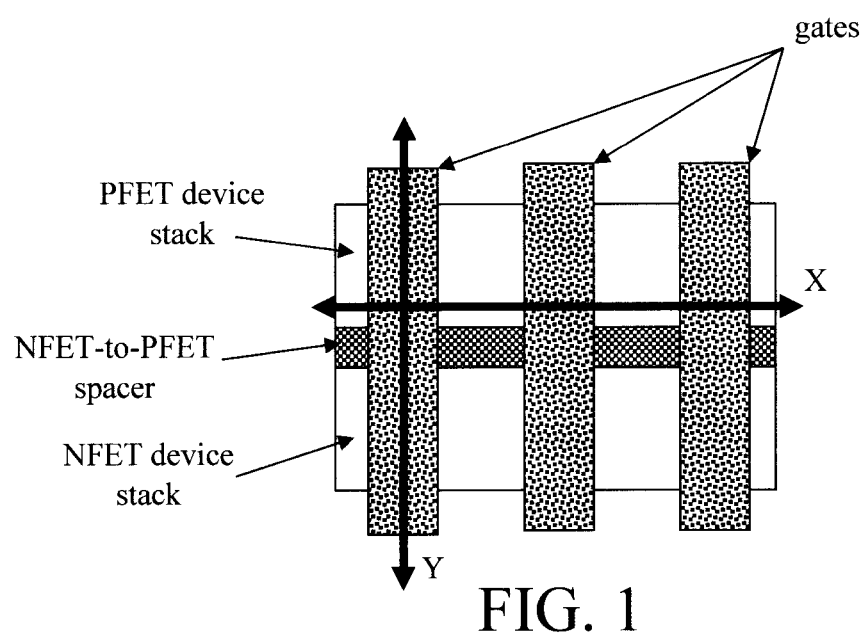
FIG. 1 is a top-down view of the general semiconductor field-effect transistor (FET) design presented herein having p-channel field-effect transistor (PFET) and n-channel FET (NFET) device stacks and gates oriented orthogonal to the device stacks according to an embodiment of the present invention.

An exemplary methodology for forming a semiconductor FET device in accordance with the present techniques is now described by way of reference to FIGS. 1-17. In each of the following figures, a cross-sectional view through a part of the semiconductor FET device will be depicted. See, for example, FIG. 1 which shows a top-down view of the general semiconductor FET device design illustrating the orientations of the various cuts through the device that will be depicted in the figures. Referring to FIG. 1, in one exemplary embodiment, the present semiconductor FET device design includes at least one n-channel FET (NFET) device stack and at least one p-channel (PFET) device stack separated by an NFET-to-PFET space, each device stack containing sacrificial and active layers with gates of the semiconductor FET device oriented orthogonal to the NFET and PFET device stacks. Sacrificial gates are shown in FIG. 1. Namely, as will be described in detail below, a replacement metal gate or RMG process is employed herein where these sacrificial gates serve as placeholders during source and drain formation, and then are later replaced with the replacement metal gates. However, the orientation of the gates with respect to the NFET and PFET device stacks is the same for both the sacrificial and replacement metal gates.

Figure 2A:
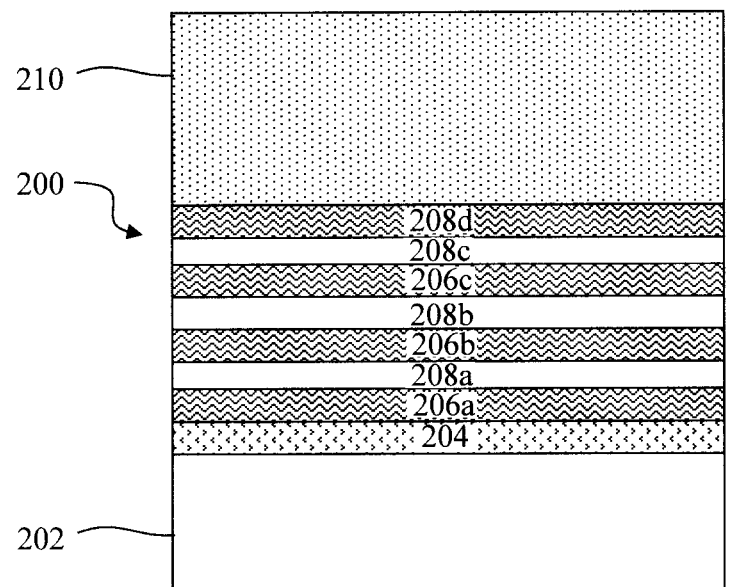
FIG. 2A is a cross-sectional diagram illustrating a stack of (first and second) sacrificial layers and active layers having been formed on a substrate, and a patterned hardmask having been formed on the stack from a view perpendicular to the gates.

As shown in FIG. 1, a cross-section X will provide views of cuts through the PFET device stack perpendicular to the gates. It is notable that the processes depicted by way of reference to the cross-section X through the PFET device stack are performed in the same manner in the NFET device stack. A cross-section Y will provide views of cuts through (and perpendicular to) the PFET and NFET device stacks through one of the gates. For instance, as shown in FIG. 2A (a cross-sectional view X), the process begins with the formation of a stack 200 of sacrificial and active layers on a substrate 202, followed by patterning of the stack 200. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

According to an exemplary embodiment, stack 200 is formed by depositing sacrificial and active layers, oriented horizontally one on top of another on substrate 202. By way of example only, in one exemplary embodiment, the sacrificial and active layers are nanosheets that are formed as a stack on substrate 202. The term 'nanosheet,' as used herein, generally refers to a sheet or a layer having nanoscale dimensions. Further, the term 'nanosheet' is meant to encompass other nanoscale structures such as nanowires. For instance, the term 'nanosheet' can refer to a nanowire with a larger width, and/or the term 'nanowire' can refer to a nanosheet with a smaller width, and vice versa.

As shown in FIG. 2A, in the present example stack 200 includes a (first) sacrificial layer 204 deposited on substrate 202, and alternating layers of (second) sacrificial layers 206a,b,c,d, etc. and active layers 208a,b,c, etc. deposited on sacrificial layer 204. The term 'sacrificial' as used herein refers to a structure that is removed, in whole or in part, during fabrication of the semiconductor FET device. By contrast, active layers 208a,b,c, etc. will remain in place and serve as channels of the semiconductor FET device. It is notable that the number of sacrificial layers 206a,b,c,d, etc. and active layers 208a,b,c, etc. shown in the figures is provided merely as an example to illustrate the present techniques. For instance, embodiments are contemplated herein where more or fewer sacrificial layers 206a,b,c,d, etc. and/or more or fewer active layers 208a,b,c, etc. are present than is shown.

According to an exemplary embodiment, the sacrificial layer 204 and each of the sacrificial layers 206a,b,c,d, etc. and active layers 208a,b,c, etc. are deposited/formed on substrate 202 using an epitaxial growth process. In one exemplary embodiment, sacrificial layer 204 and the sacrificial layers 206a,b,c,d, etc. and active layers 208a,b,c, etc. are each formed have a thickness of from about 6 nanometers (nm) to about 25 nm and ranges therebetween.

As will become apparent from the description that follows, the materials employed for sacrificial layers 206a,b,c,d, etc. and active layers 208a,b,c, etc. are such that the sacrificial layers 206a,b,c,d, etc. can be removed selective to the active layers 208a,b,c, etc. during the semiconductor device fabrication. Further, the material employed for sacrificial layer 204 is such that sacrificial layer 204 can be removed selective to sacrificial layers 206a,b,c,d, etc. during the semiconductor device fabrication in order to form a bottom dielectric isolation layer. A bottom dielectric isolation layer is needed to prevent source-to-drain leakage via the substrate 202.

By way of example only, according to an exemplary embodiment, sacrificial layer 204 and sacrificial layers 206a,b,c,d, etc. are each formed from SiGe, while active layers 208a,b,c, etc. are formed from Si. Etchants such as wet hot SC1, vapor phase hydrogen chloride (HCl), vapor phase chlorine trifluoride ($ClF_3$) and other reactive clean processes (RCP) are selective for etching of SiGe versus Si.

Further, high germanium (Ge) content SiGe can be removed selective to low Ge content SiGe using an etchant such as dry HCl. Thus, according to an exemplary embodiment, sacrificial layer 204 is formed from SiGe having a high Ge content. For instance, in one embodiment, a high Ge content SiGe is SiGe having from about 50% Ge to about 100% Ge (i.e., pure Ge) and ranges therebetween. For instance, in one non-limiting example, sacrificial layer 204 is formed from SiGe60 (which is SiGe having a Ge content of about 60%). Use of a higher Ge content SiGe will enable the sacrificial layer 204 to be etched selective to sacrificial layers 206a,b,c,d, etc. when forming the bottom dielectric isolation layer (see below). In that case, sacrificial layers 206a,b,c,d, etc. are preferably formed from a low Ge content SiGe. For instance, in one exemplary embodiment, a low Ge content SiGe is SiGe having from about 20% Ge to about 50% Ge and ranges therebetween. For instance, in one non-limiting example, sacrificial layers 206*a,b,c,d* etc. are formed from SiGe30 (which is SiGe having a Ge content of about 30%).

Standard lithography and etching techniques are then employed to pattern the stack 200. As will be described in detail below, this patterning of the stack 200 enables shallow trench isolation (STI) regions to be formed in the substrate 202 at the base of the PFET and NFET stacks. However, formation of the STI regions will not be performed until after the sacrificial layer 204 has been removed and replaced with the bottom dielectric isolation layer. Doing so advantageously avoids sacrificial layer 204 from being oxidized prior to its removal. As highlighted above, SiGe which has not been oxidized is more easily removed.

With standard lithography and etching processes, a lithographic stack (not shown), e.g., photoresist/organic planarizing layer (OPL)/anti-reflective coating (ARC), is used to pattern a hardmask 210 on the stack 200 with the footprint and location of trenches 212 (see below). Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, the hardmask 210 can be formed by other suitable techniques, including but not limited to, sidewall image transfer (SIT), self-aligned double patterning (SADP), self-aligned quadruple patterning (SAQP), and other self-aligned multiple patterning (SAMP).

Figure 2B:
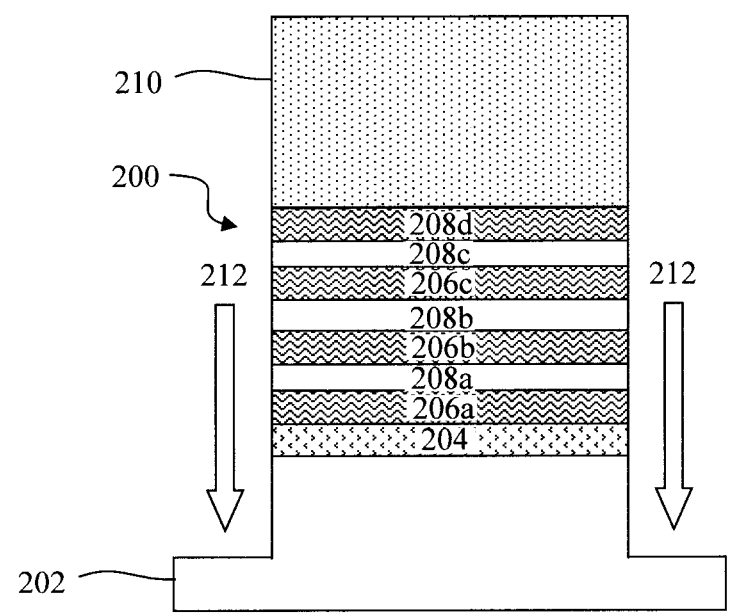
FIG. 2B is a cross-sectional diagram illustrating the stack of (first and second) sacrificial layers and active layers having been formed on a substrate, the patterned hardmask having been formed on the stack, and the stack having been patterned from a view through one of the gates according to an embodiment of the present invention.

An etch is then used to transfer the pattern from the hardmask to the underlying stack 200. A directional (anisotropic) etching process such as reactive ion etching (RIE) can be employed. In this particular example, the stack 200 is not etched along the cross-section X. However, referring to FIG. 2B (a cross-sectional view Y) it can be seen that trenches 212 have now been patterned in the stack 200 and substrate 202. As shown in FIG. 2B, trenches 212 extend completely through stack 200 and partway through substrate 202.

The next task is to open an NFET-to-PFET space in the stack 200. By way of this process, stack 200 will be divided into at least one PFET device stack and at least one NFET device stack that are separated from one another by the NFET-to-PFET space. To do so, a patterned block mask 302 is first formed on the stack 200. See FIG. 3A (a cross-sectional view X). Suitable block mask materials include, but are not limited to, organic planarizing layer (OPL) materials which can be deposited onto the stack 200 using a process such as spin-on coating, chemical vapor deposition (CVD), atomic layer deposition (ALD) or physical vapor deposition (PVD).

Figure 3A:
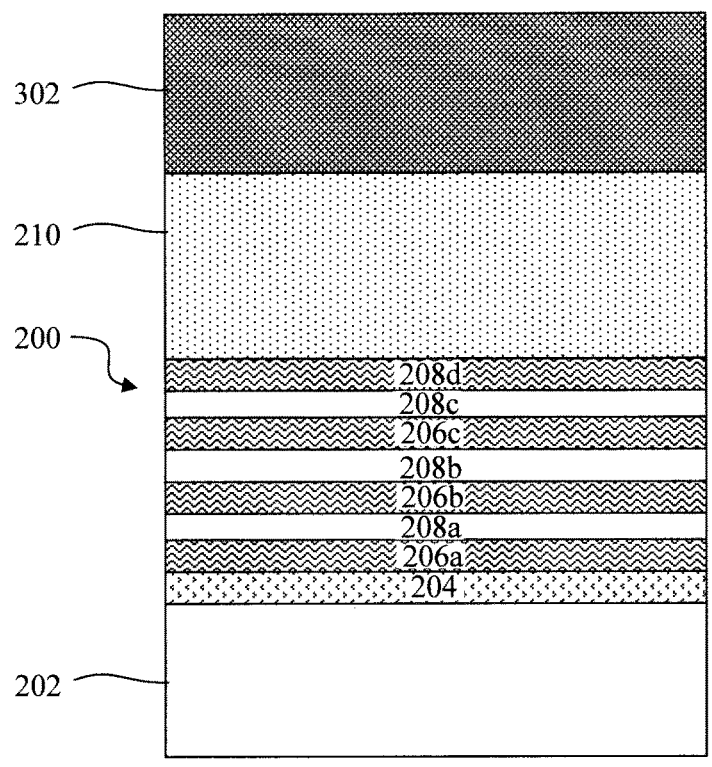
FIG. 3A is a cross-sectional diagram illustrating a patterned block mask having been formed on the stack from a view perpendicular to the gates.
Figure 3B:
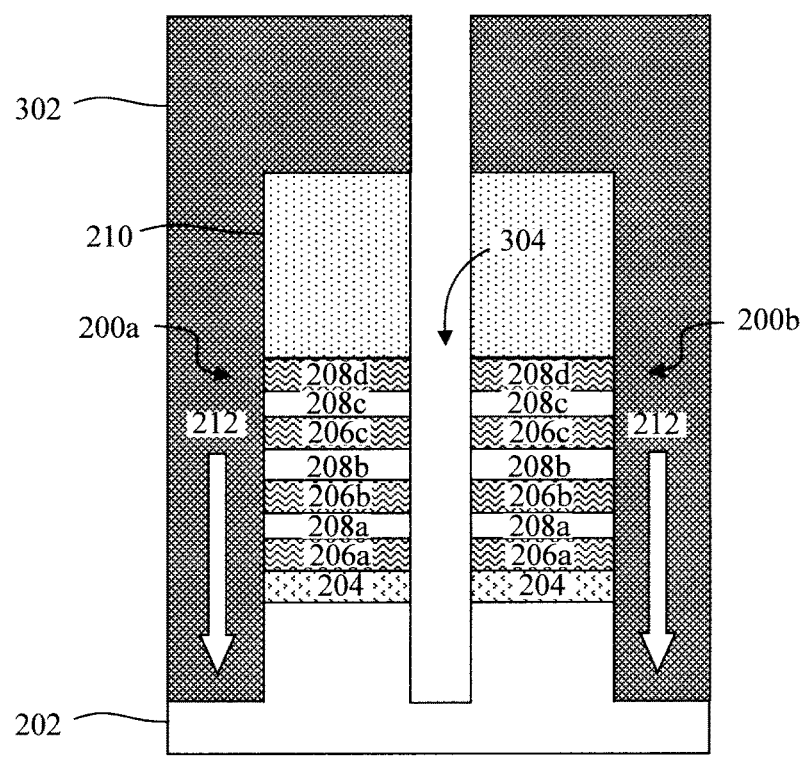
FIG. 3B is a cross-sectional diagram illustrating the patterned block mask having been formed on the stack, and an etch having been performed to form an NFET-to-PFET space in the hardmask and the stack that divides the stack into at least one PFET device stack and at least one NFET device stack from a view through one of the gates according to an embodiment of the present invention.

As shown in FIG. 3B (a cross-sectional view Y), an etch using the patterned block mask 302 is then performed to form an NFET-to-PFET space 304 in hardmask 210 and stack 200. A directional (anisotropic) etching process such as RIE can be employed to form the NFET-to-PFET space 304 in stack 200. As described above, the NFET-to-PFET space 304 etch divides the stack 200 into at least one PFET device stack 200*a* and at least one NFET device stack 200*b* that are separated from one another by the NFET-to-PFET space 304. See FIG. 3B.

Figure 4:
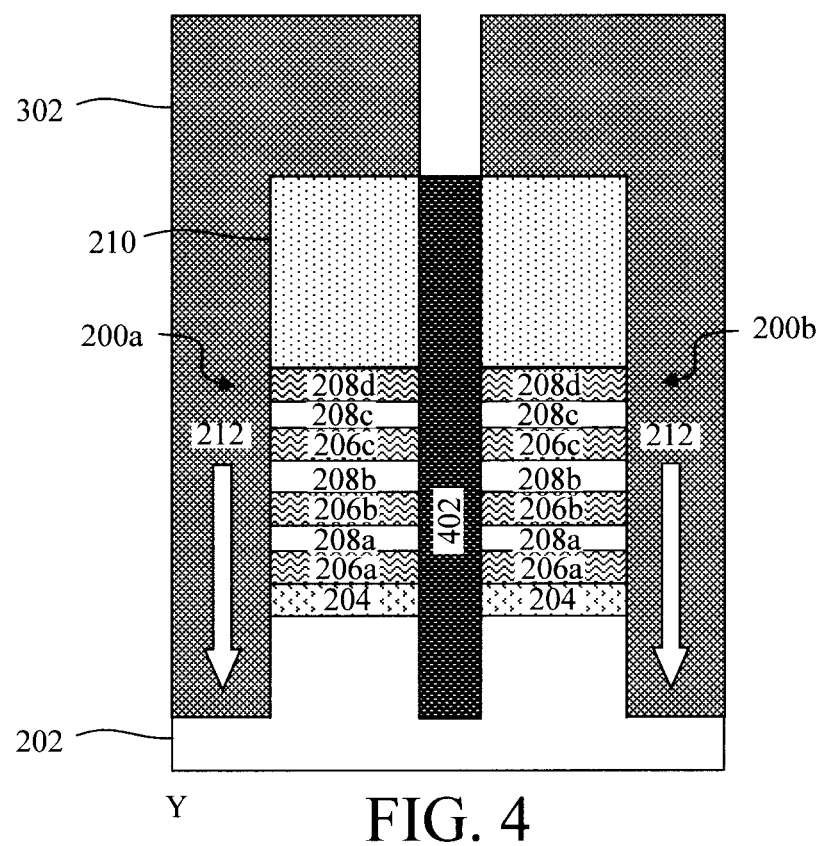
FIG. 4 is a cross-sectional diagram illustrating an NFET-to-PFET spacer having been formed in the NFET-to-PFET space separating the PFET device stack from the NFET device stack from a view through one of the gates according to an embodiment of the present invention.

A dielectric material is then deposited into and filling the NFET-to-PFET space 304, followed by an etch back to form (NFET-to-PFET) spacer 402 in the NFET-to-PFET space 304 separating the PFET device stack 200*a* from the NFET device stack 200*b*. See FIG. 4 (a cross-sectional view Y). Suitable dielectric materials include, but are not limited to, silicon oxide (SiOx) and/or silicon nitride (SiN). A process such as CVD, ALD or PVD can be employed to deposit the dielectric material into and filling the NFET-to-PFET space 304. The etch back of the dielectric material can be performed using a plasma dry etch process. As shown in FIG. 4, at this stage in the process the top surface of spacer 402 is substantially coplanar with the top surface of the hardmask 210.

Figure 5A:
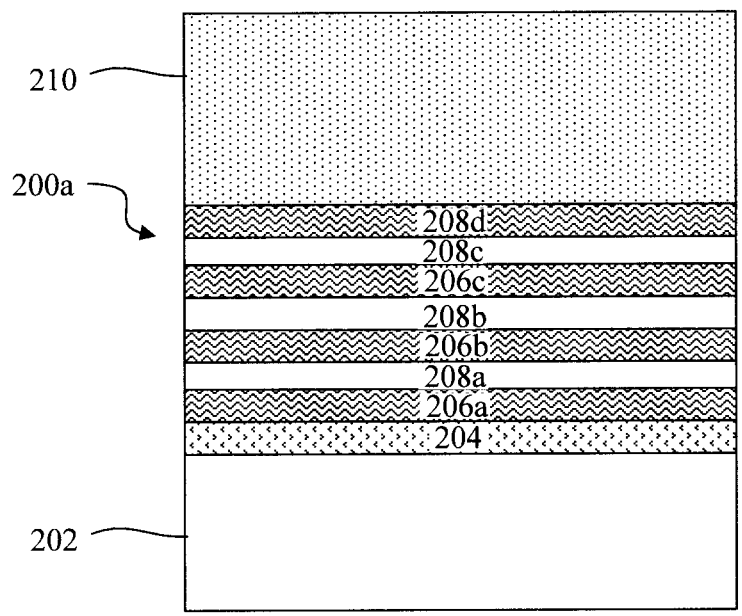
FIG. 5A is a cross-sectional diagram illustrating the block mask having been removed from a view perpendicular to the gates.
Figure 5B:
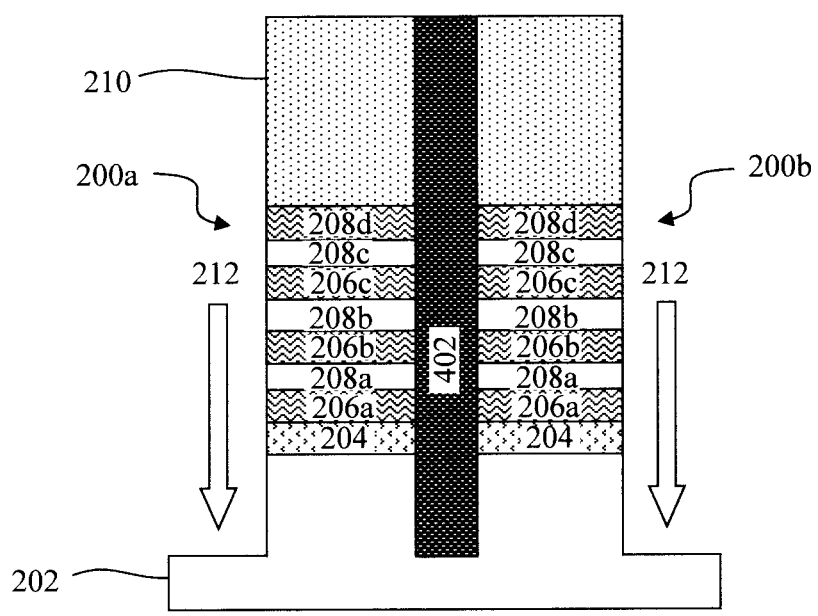
FIG. 5B is a cross-sectional diagram illustrating the block mask having been removed from a view through one of the gates according to an embodiment of the present invention.

The block mask 302 is then removed. See FIG. 5A (a cross-sectional view X). As provided above, block mask 302 can be formed from an OPL material, which can be removed using an ashing process. FIG. 5B (a cross-sectional view Y) illustrates removal of the block mask 302 from another perspective, i.e., perpendicular to the PFET and NFET device stacks 200*a* and 200*b*.

Figure 6A:
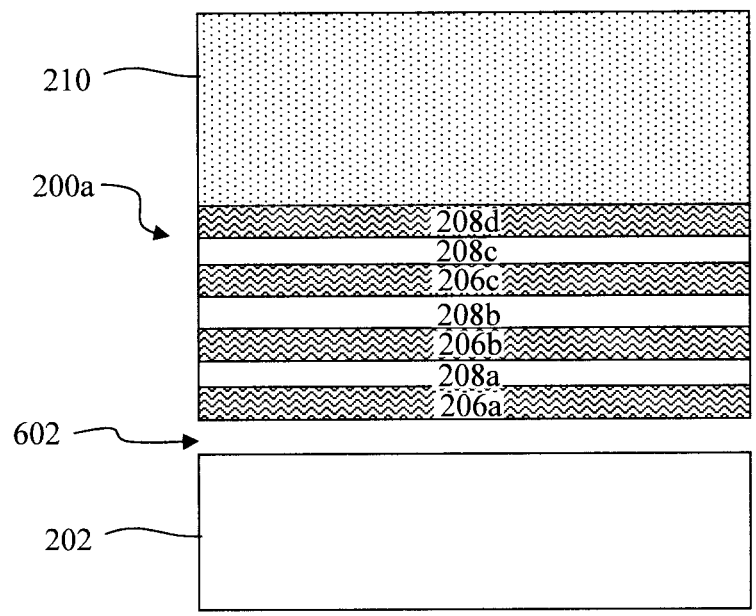
FIG. 6A is a cross-sectional diagram illustrating the first sacrificial layer having been selectively removed forming a cavity at the bottom of the PFET and NFET device stacks from a view perpendicular to the gates.
Figure 6B:
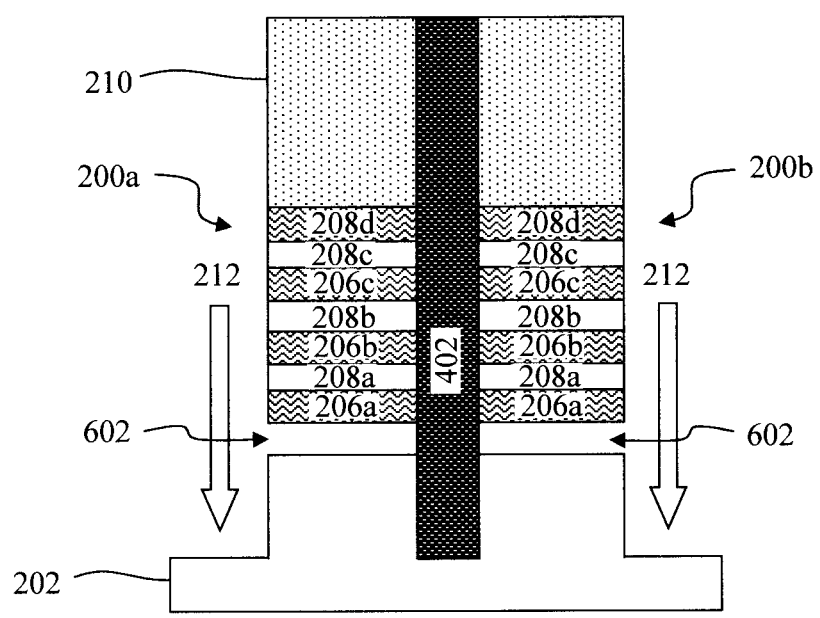
FIG. 6B is a cross-sectional diagram illustrating the first sacrificial layer having been selectively removed forming a cavity at the bottom of the PFET and NFET device stacks from a view through one of the gates according to an embodiment of the present invention.

A bottom dielectric isolation layer is next formed below the PFET and NFET device stacks 200*a* and 200*b*. As provided above, a bottom dielectric isolation layer is needed to prevent source-to-drain leakage via the substrate 202. To form the bottom dielectric isolation layer, sacrificial layer 204 is first selectively removed from the PFET and NFET device stacks 200*a* and 200*b*. See FIG. 6A (a cross-sectional view X). As provided above, sacrificial layer 204 can be formed from high Ge content SiGe (e.g., SiGe having from about 50% Ge to about 100% Ge (i.e., pure Ge) and ranges therebetween, such as SiGe60). In that case, an etchant such as dry HCl can be used to remove sacrificial layer 204 forming a cavity 602 at the bottom of the PFET and NFET device stacks 200*a* and 200*b*. As provided above, formation of the STI regions has not yet been performed which advantageously avoids sacrificial layer 204 from being oxidized prior to its removal, and thus sacrificial layer 204 can be more easily removed. FIG. 6B (a cross-sectional view Y) illustrates removal of the sacrificial layer 204 forming the cavity 602 at the bottom of the PFET and NFET device stacks 200*a* and 200*b* from another perspective, i.e., perpendicular to the PFET and NFET device stacks 200*a* and 200*b*. The NFET-to-PFET spacer 402 helps hold the structure after the sacrificial layer 204 is removed from the bottom of the stacks.

Figure 7A:
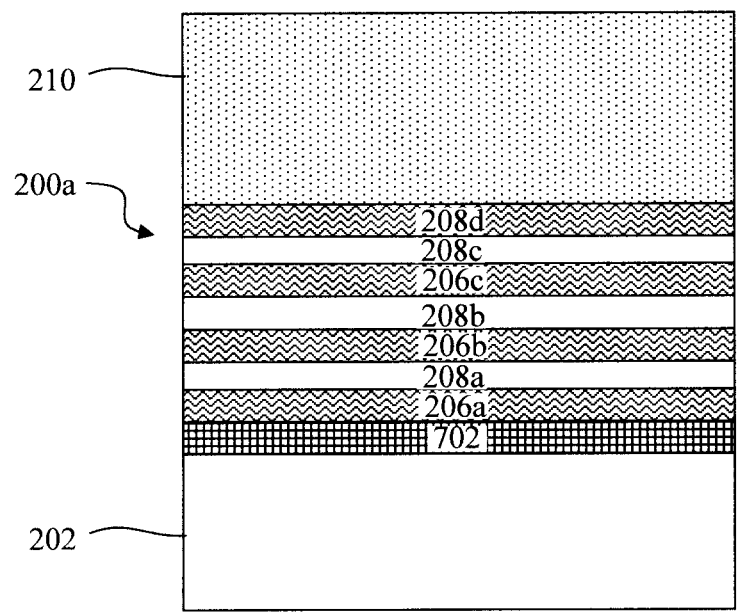
FIG. 7A is a cross-sectional diagram illustrating a dielectric material having been deposited into the cavity forming a bottom dielectric isolation layer on the substrate below the PFET and NFET device stacks from a view perpendicular to the gates.
Figure 7B:
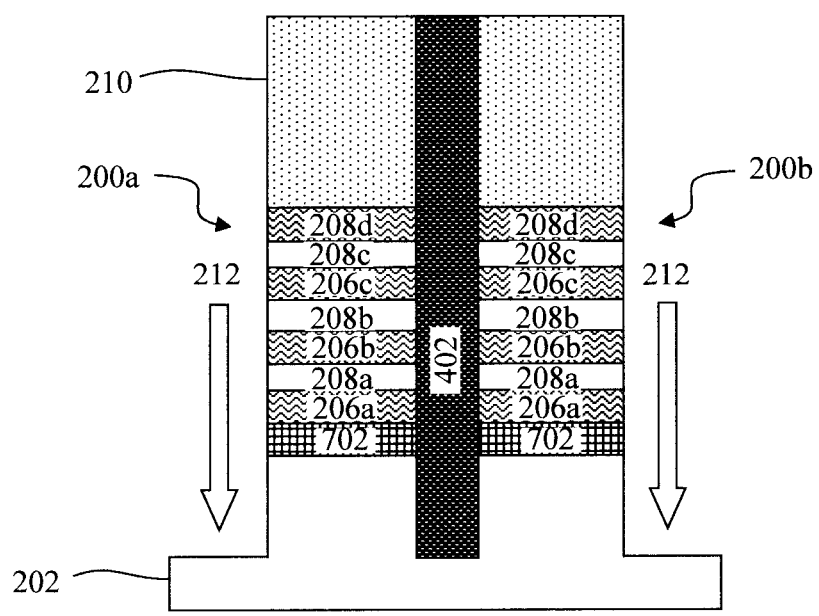
FIG. 7B is a cross-sectional diagram illustrating the dielectric material having been deposited into the cavity forming the bottom dielectric isolation layer on the substrate below the PFET and NFET device stacks from a view through one of the gates according to an embodiment of the present invention.
Figure 8A:
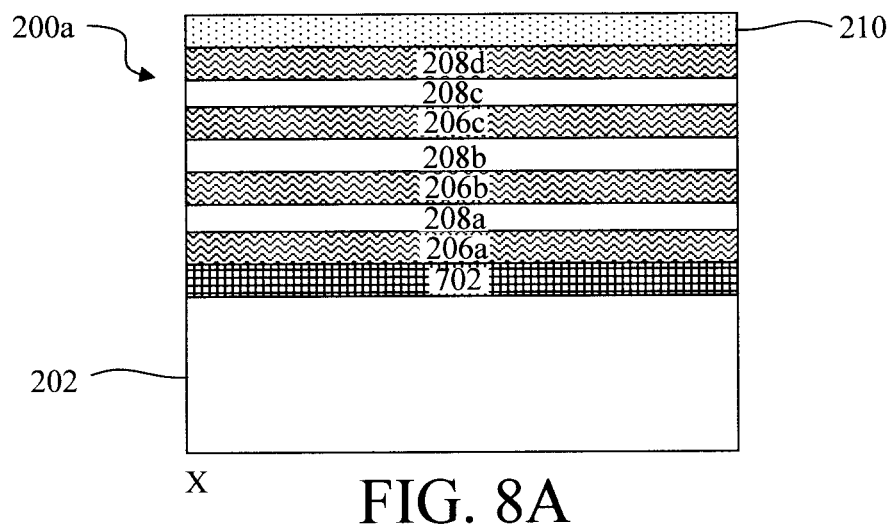
FIG. 8A is a cross-sectional diagram illustrating the hardmask having been thinned from a view perpendicular to the gates.
Figure 8B:
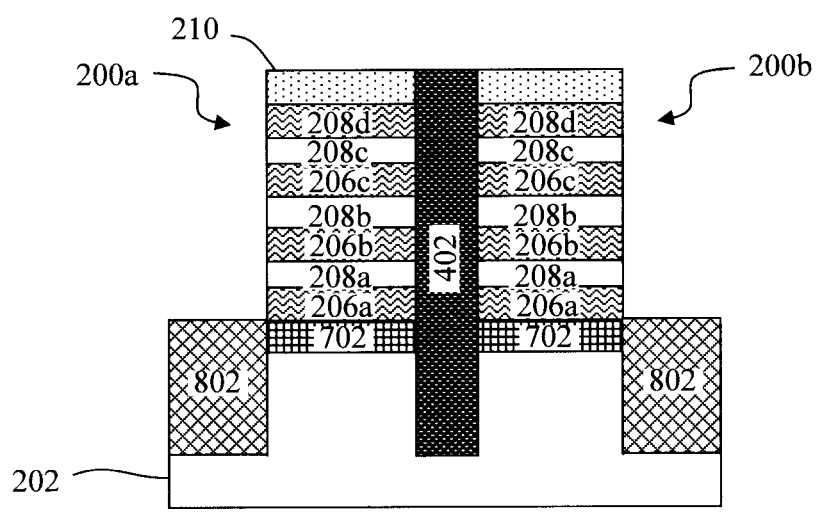
FIG. 8B is a cross-sectional diagram illustrating shallow trench isolation (STI) regions having been formed in the substrate at the base of the PFET and NFET device stacks, and the hardmask having been thinned from a view through one of the gates according to an embodiment of the present invention.

A dielectric material is then deposited into the cavity 602 forming the bottom dielectric isolation layer 702 on substrate 202 below the PFET and NFET device stacks 200*a* and 200*b*. See FIG. 7A (a cross-sectional view X). Suitable dielectric materials for bottom dielectric isolation layer 702 include, but are not limited to, SiOx and/or SiN. A process such as CVD, ALD or PVD can be employed to deposit the dielectric material into cavity 602, followed by an isotropic etch back process to remove the dielectric material elsewhere except the material which pinches-off cavity 602. FIG. 7B (a cross-sectional view Y) illustrates formation of the bottom dielectric isolation layer 702 in cavity 602 from another perspective, i.e., perpendicular to the PFET and NFET device stacks 200*a* and 200*b*.

Now that sacrificial layer 204 has been removed and replaced with bottom dielectric isolation layer 702, the STI regions are formed in the trenches 212 at the base of the PFET and NFET device stacks 200*a* and 200*b*, accompanied by a thinning of the hardmask 210. While the STI regions are not visible along the cross-section X, FIG. 8A (a cross-sectional view X) illustrates the hardmask 210 having been thinned. Thinning of the hardmask 210 is advantageous because the presence of a tall hardmask increases the difficulty of subsequent processes, like gate patterning. By way of example only, a process such as chemical mechanical polishing (CMP) can be employed to thin hardmask 210. On the other hand, FIG. 8B (a cross-sectional view Y), illustrates STI regions 802 having been formed in the trenches 212 at the base of the PFET and NFET device stacks 200*a* and 200*b* and the hardmask 210 having been thinned. STI regions 802 serve to isolate the PFET and NFET device stacks 200*a* and 200*b*.

STI regions 802 are formed by filling trenches 212 with a dielectric such as an oxide (which may also be generally referred to herein as an 'STI oxide') and then recessing the STI oxide. Although not explicitly shown in the figures, a liner (e.g., a thermal oxide or silicon nitride (SiN)) may be deposited into the trenches prior to the STI oxide. Suitable STI oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD, or PVD can be used to deposit the STI oxide. An oxide-selective etch can then be employed to recess the STI oxide.

Figure 9A:
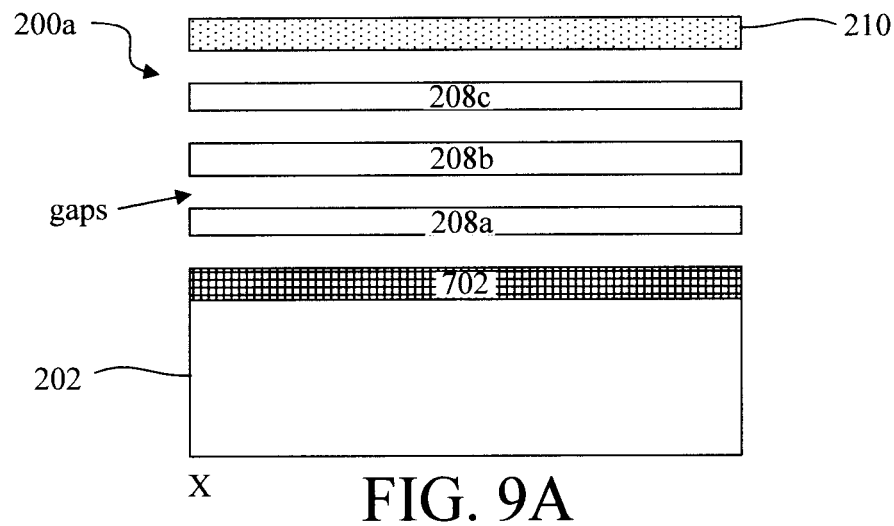
FIG. 9A is a cross-sectional diagram illustrating the second sacrificial layers having been selectively removed forming gaps between the active layers in the PFET and NFET device stacks from a view perpendicular to the gates.
Figure 9B:
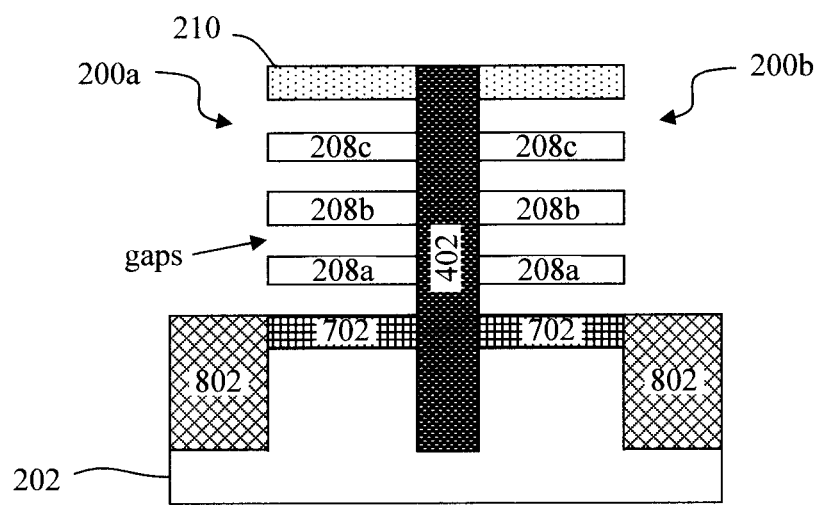
FIG. 9B is a cross-sectional diagram illustrating the second sacrificial layers having been selectively removed forming gaps between the active layers in the PFET and NFET device stacks from a view through one of the gates according to an embodiment of the present invention.

The sacrificial layers 206*a,b,c,d*, etc. are then selectively removed forming gaps between the active layers 208*a,b,c*, etc. in the PFET and NFET device stacks 200*a* and 200*b*. See FIG. 9A (a cross-sectional view X). As provided above, sacrificial layers 206*a,b,c,d*, etc. can be formed from low Ge content SiGe (e.g., SiGe having from about 20% Ge to about 50% Ge and ranges therebetween, such as SiGe30). In that case, etchants such as wet hot SC1, vapor phase hydrogen chloride (HCl), vapor phase chlorine trifluoride ($ClF_3$) and other reactive clean processes (RCP) can be used to remove sacrificial layers 206*a,b,c,d*, etc. selective to active layers 208*a,b,c*, etc. FIG. 9B (a cross-sectional view Y) illustrates removal of the sacrificial layers 206*a,b,c,d*, etc. and formation of the gaps between the active layers 208*a,b,c*, etc. in the PFET and NFET device stacks 200*a* and 200*b* from another perspective, i.e., perpendicular to the PFET and NFET device stacks 200*a* and 200*b*. The NFET-to-PFET spacer 402 helps to hold the structure after the sacrificial layers 206*a,b,c,d*, etc. are removed.

It is notable that there has been a low thermal budget up to this point in the process. For instance, the high temperature processes associated with source and drain formation have not yet been performed. As provided above, high-temperature processing can lead to diffusion of Ge from the sacrificial layers into the Si active layers leading to poor interface quality and/or degraded electron mobility. However, advantageously, the sacrificial layers 206*a,b,c,d*, etc. are now removed before any of this Ge diffusion can occur.

Figure 10A:
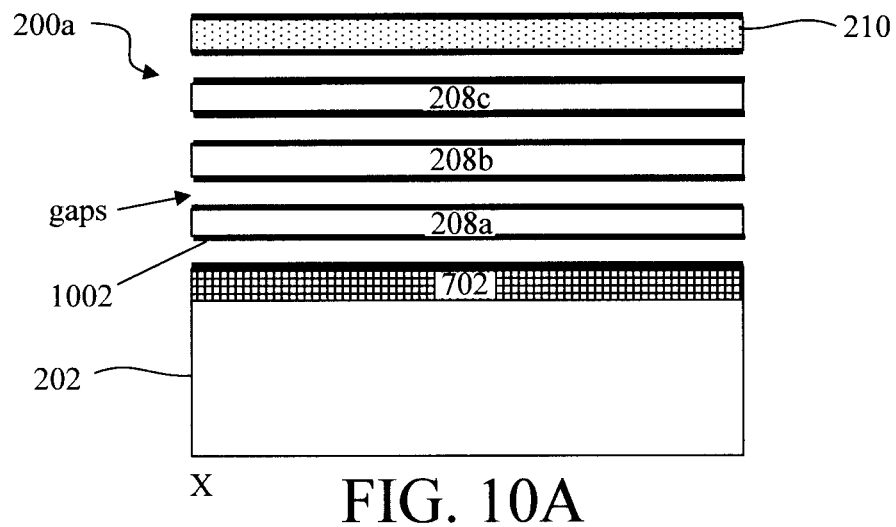
FIG. 10A is a cross-sectional diagram illustrating a conformal gate dielectric having been deposited onto the hardmask and bottom dielectric isolation layer, and into the gaps wrapping around the active layers in the PFET and NFET device stacks from a view perpendicular to the gates.
Figure 10B:
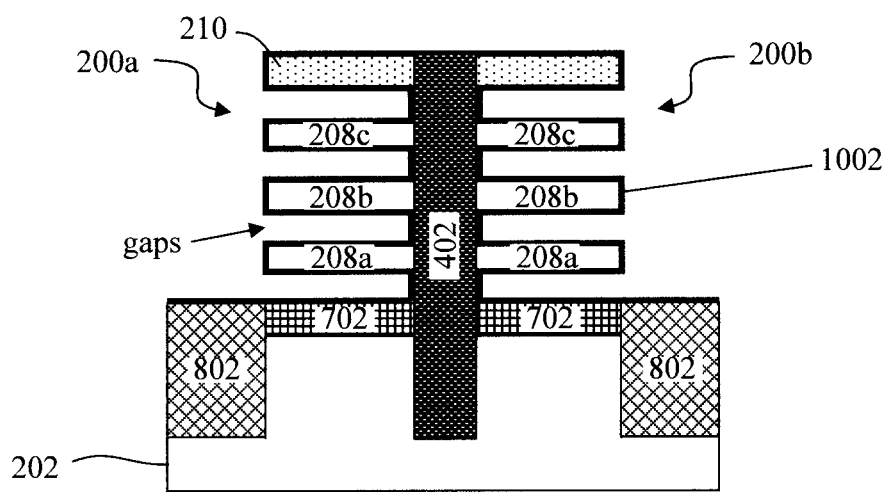
FIG. 10B is a cross-sectional diagram illustrating a conformal gate dielectric having been deposited onto the hardmask and bottom dielectric isolation layer, and into the gaps wrapping around the active layers in the PFET and NFET device stacks from a view through one of the gates according to an embodiment of the present invention.

A conformal gate dielectric 1002 is then deposited onto hardmask 210 and bottom dielectric isolation layer 702, and into the gaps wrapping around the active layers 208*a,b,c*, etc. in the PFET and NFET device stacks 200*a* and 200*b*. See FIG. 10A (a cross-sectional view X). According to an exemplary embodiment, gate dielectric 1002 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as CVD, ALD or PVD can be employed to deposit the gate dielectric 1002 onto the hardmask 210 and into and lining the gaps. According to an exemplary embodiment, gate dielectric 1002 has a thickness of from about 1 nanometer (nm) to about 5 nm and ranges therebetween. FIG. 10B (a cross-sectional view Y) illustrates gate dielectric 1002 having been deposited onto the hardmask 210 and bottom dielectric isolation layer 702, and into and lining the gaps between the active layers 208*a,b,c*, etc. in the PFET and NFET device stacks 200*a* and 200*b* from another perspective, i.e., perpendicular to the PFET and NFET device stacks 200*a* and 200*b*.

Figure 11A:
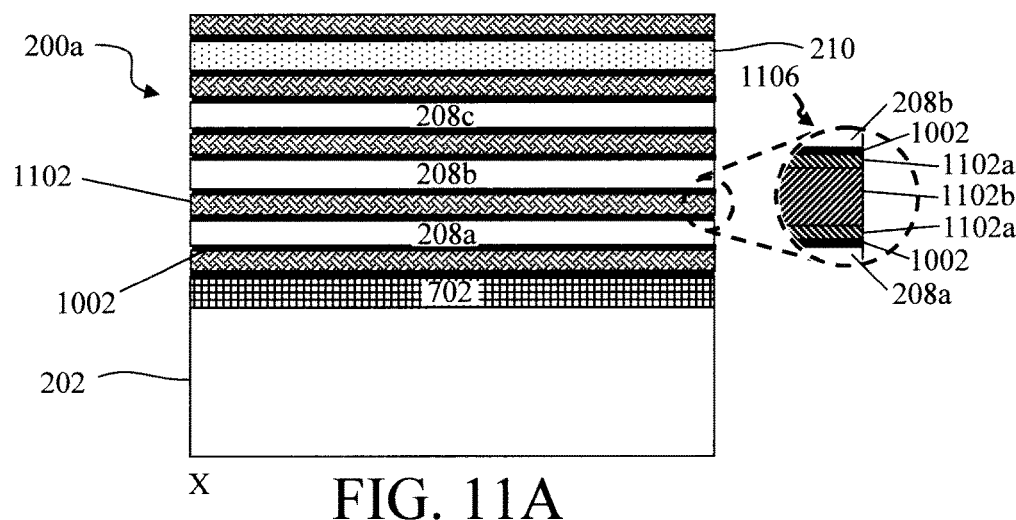
FIG. 11A is a cross-sectional diagram illustrating a sacrificial material having been deposited onto the hardmask and bottom dielectric isolation layer, and into the gaps between the active layers over the gate dielectric in the PFET and NFET device stacks from a view perpendicular to the gates.
Figure 11B:
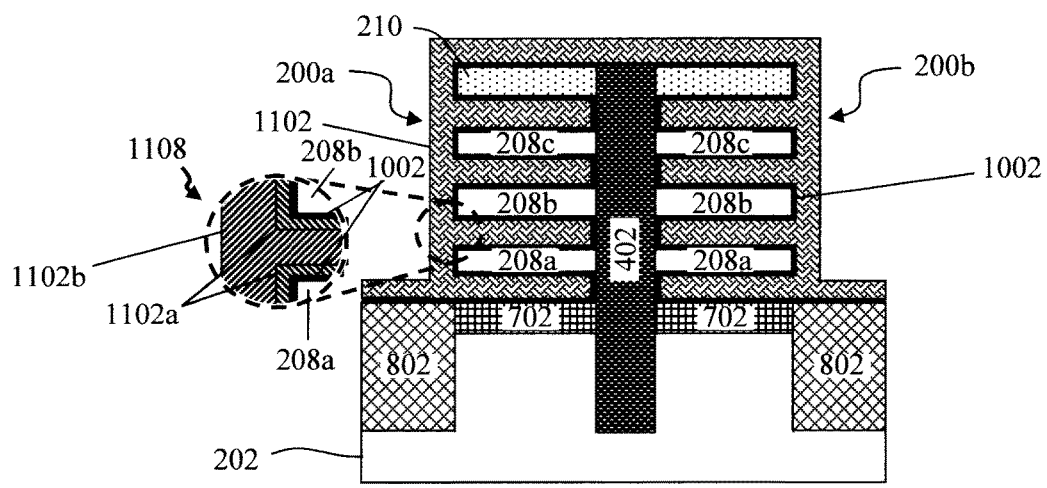
FIG. 11B is a cross-sectional diagram illustrating a sacrificial material having been deposited onto the hardmask and bottom dielectric isolation layer, and into the gaps between the active layers over the gate dielectric in the PFET and NFET device stacks from a view through one of the gates according to an embodiment of the present invention.

A sacrificial material 1102 is then deposited onto hardmask 210 and bottom dielectric isolation layer 702, and into the gaps between the active layers 208*a,b,c*, etc. (over the gate dielectric 1002) in the PFET and NFET device stacks 200*a* and 200*b*. See FIG. 11A (a cross-sectional view X). According to an exemplary embodiment, sacrificial material 1102 includes a metal nitride layer 1102*a* deposited on the gate dielectric 1002 and an amorphous SiGe layer 1102*b* deposited on the metal nitride layer 1102*a* that fully pinches off the gaps between the active layers 208*a,b,c*, etc. See, e.g., magnified view 1106. Suitable metal nitrides for layer 1102*a* include, but are not limited to, titanium nitride (TiN). A process such as ALD can be employed to deposit the metal nitride layer 1102*a* and the amorphous SiGe layer 1102*b*. According to an exemplary embodiment, metal nitride layer 1102*a* has a thickness of from about 10 angstroms (Å) to about 15 Å and ranges therebetween, and amorphous SiGe layer 1102*b* has a thickness of from about 90 Å to about 100 Å and ranges therebetween. FIG. 11B (a cross-sectional view Y) illustrates the sacrificial material 1102 having been deposited onto hardmask 210 and bottom dielectric isolation layer 702, and into the gaps between the active layers 208*a,b,c*, etc. in the PFET and NFET device stacks 200*a* and 200*b* from another perspective, i.e., perpendicular to the PFET and NFET device stacks 200*a* and 200*b*. As shown, e.g., in magnified view 1108 in FIG. 11B, in this exemplary embodiment the sacrificial material 1102 includes metal nitride layer 1102*a* (e.g., TiN) deposited on the gate dielectric 1002 and amorphous SiGe layer 1102*b* deposited on the metal nitride layer 1102*a* that fully pinches off the gaps between the active layers 208*a,b,c*, etc.

Removing the sacrificial layers 206*a,b,c,d*, etc. and replacing them with sacrificial material 1102 advantageously avoids Ge diffusion into the active layers 208*a,b,c*, etc. during source and drain high thermal processing. Namely, in the original device stacks, the (SiGe) sacrificial layers 206*a,b,c,d*, etc. had been in direct contact with the (Si) active layers 208*a,b,c*, etc. If this configuration was implemented through source and drain formation, then the high thermal budget would cause Ge diffusion into the active layers 208*a,b,c*, etc. However, now that the sacrificial layers 206*a,b,c,d*, etc. have been replaced with sacrificial material 1102, there is no longer any direct contact between the (Si) active layers 208*a,b,c*, etc. and SiGe, i.e., at least the metal nitride layer 1102*a* separates the amorphous SiGe layer 1102*b* active layers 208*a,b,c*, etc.

A reliability anneal can be performed following deposition of the sacrificial material 1102. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as nitrogen.

Figure 12A:
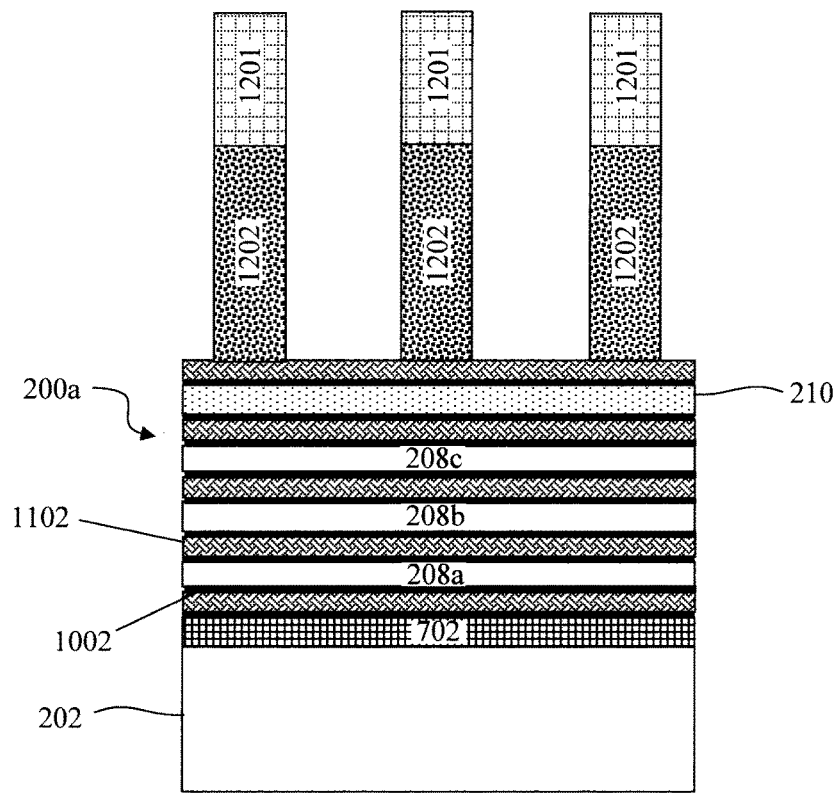
FIG. 12A is a cross-sectional diagram illustrating sacrificial gate hardmasks and sacrificial gates having been formed on the PFET and NFET device stacks from a view perpendicular to the gates.

Next, sacrificial gates 1202 are formed on the PFET and NFET device stacks 200*a* and 200*b* over channel regions of the semiconductor FET device. See FIG. 12A (a cross-sectional view X). It is notable that while FIG. 12A provides a view of a cut through device stack 201*a*, the process flow is the same for device stack 201*b*. To form sacrificial gates 1202, a sacrificial gate material is first blanket deposited over the PFET and NFET device stacks 200*a* and 200*b*.

Suitable sacrificial gate materials include, but are not limited to, ploy-silicon (poly-Si) and/or amorphous silicon (a-Si). A process such as CVD, ALD or PVD can be employed to deposit the sacrificial gate material over the PFET and NFET device stacks 200a and 200b. According to an exemplary embodiment, a thin (e.g., from about 1 nanometer (nm) to about 3 nm) layer of silicon oxide (SiOx) is first formed on the PFET and NFET device stacks 200a and 200b, followed by the poly-Si and/or a-Si.

Figure 12B:
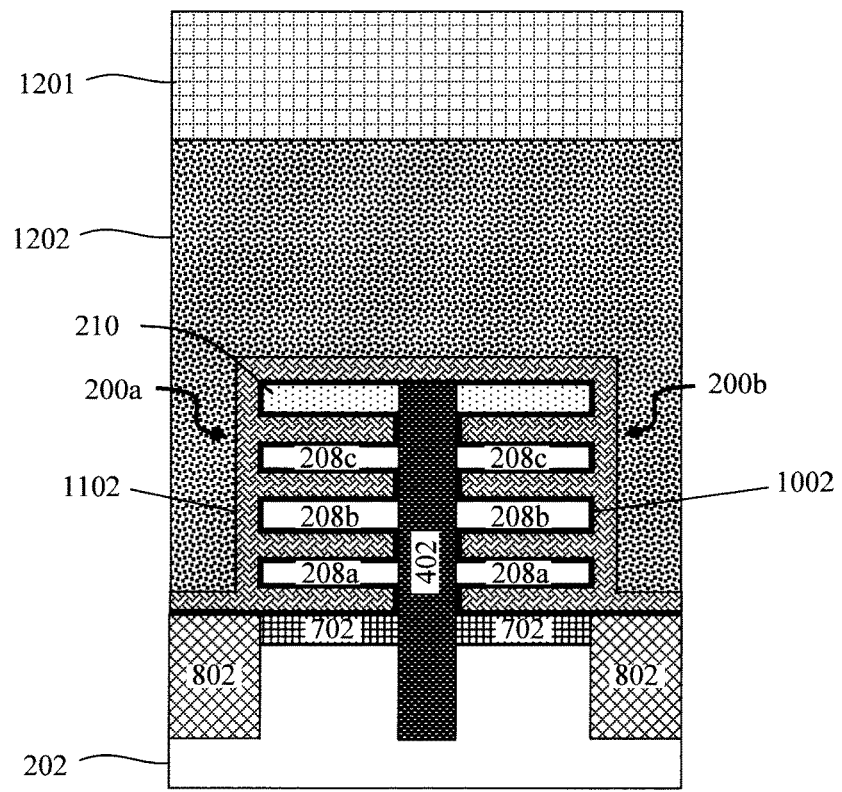
FIG. 12B is a cross-sectional diagram illustrating sacrificial gate hardmasks and sacrificial gates having been formed on the PFET and NFET device stacks from a view through one of the gates according to an embodiment of the present invention.

Sacrificial gate hardmasks 1201 are then formed on the sacrificial gate material marking the footprint and location of each of the sacrificial gates 1202. Suitable materials for the sacrificial gate hardmasks 1201 include, but are not limited to, nitride hardmask materials such as SiN, SiON and/or silicon carbide nitride (SiCN), and/or oxide hardmask materials such as SiOx. An etch using the sacrificial gate hardmasks 1201 is then used to pattern the sacrificial gate material into the individual sacrificial gates 1202 shown in FIG. 12A. A directional (anisotropic) etching process such as RIE can be employed for the sacrificial gate etch. FIG. 12B (a cross-sectional view Y) illustrates sacrificial gate hardmasks 1201 and sacrificial gates 1202 having been formed on the PFET and NFET device stacks 200a and 200b over channel regions of the semiconductor FET device from another perspective, i.e., perpendicular to the PFET and NFET device stacks 200a and 200b.

Figure 13:
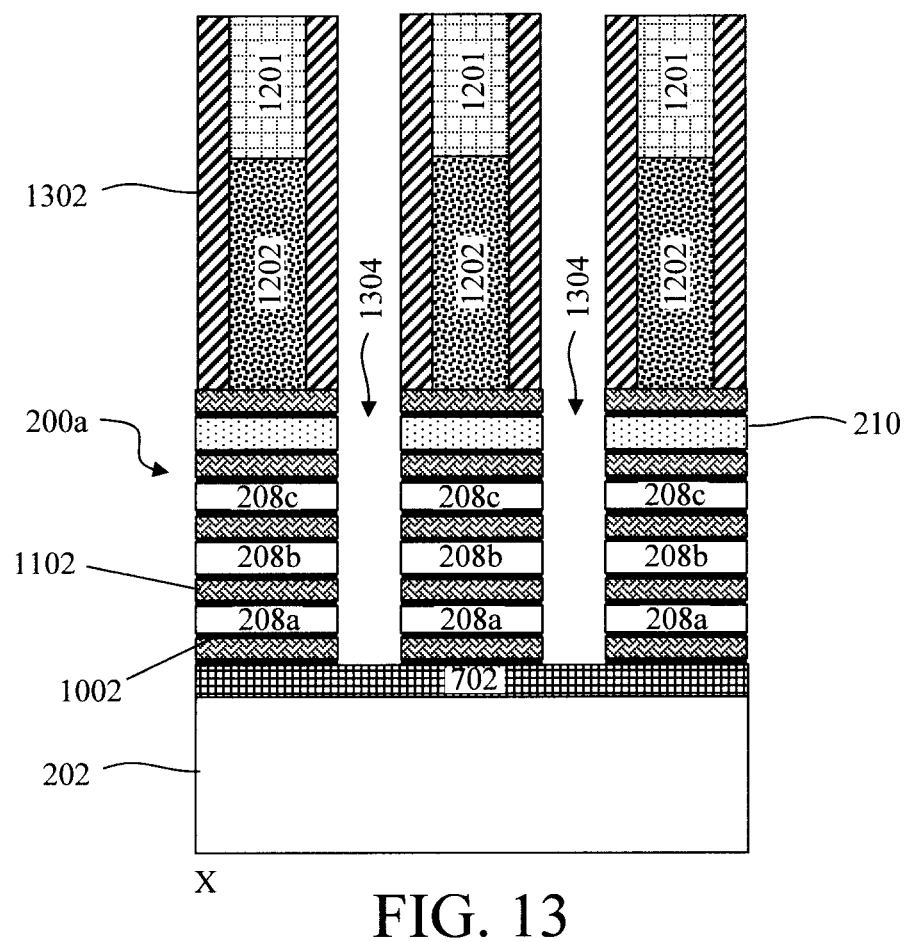
FIG. 13 is a cross-sectional diagram illustrating dielectric spacers having been formed alongside the sacrificial gate hardmasks and sacrificial gates, and the sacrificial gates and dielectric spacers having been used as a mask to pattern trenches in the PFET and NFET device stacks in between the sacrificial gates from a view perpendicular to the gates according to an embodiment of the present invention.

As shown in FIG. 13 (a cross-sectional view X), dielectric spacers 1302 are then formed alongside the sacrificial gate hardmasks 1201 and sacrificial gates 1202. Suitable materials for dielectric spacers 1302 include, but are not limited to, SiOx, SiC, SiCO, silicon borocarbonitride (SiBCN) and/or silicon oxycarbonitride (SiOCN). A process such as CVD, ALD or PVD can be employed to deposit the dielectric spacer material over the sacrificial gate hardmasks 1201/sacrificial gates 1202, followed by a directional (anisotropic) etching process such as RIE to pattern the dielectric spacer material into the dielectric spacers 1302 alongside the sacrificial gate hardmasks 1201/sacrificial gates 1202.

As highlighted above, sacrificial gates 1202 will serve as a placeholder for the final gates of the semiconductor FET device. Specifically, sacrificial gates 1202 will be removed later on in the process and replaced with metal gate stacks that will serve as the final gates of the semiconductor FET device. Thus, these final gates of the semiconductor FET device are also referred to herein as "replacement metal gates" or simply "RMG." Use of a replacement metal gate process is advantageous because it prevents exposure of the metal gate stack materials to potentially damaging conditions during subsequent processing steps. For instance, the high-κ dielectrics used in the replacement metal gate stacks can be damaged by exposure to high temperatures. Thus, these gate stack materials are only placed near the end of the process.

Sacrificial gates 1202 and dielectric spacers 1302 are then used as a mask to pattern trenches 1304 in the PFET and NFET device stacks 200a and 200b in between the sacrificial gates 1202. A directional (anisotropic) etching process such as RIE can be employed for the trench etch. As shown in FIG. 13, trenches 1304 extend through sacrificial material 1102 and each of the active layers 208a,b,c, etc., stopping on the bottom dielectric isolation layer 702. Although not explicitly shown in the figures, the same processes are employed to form dielectric spacers and trenches in the NFET device stack 200b.

The gate dielectric 1002 and sacrificial material 1102 in between the active layers 208a,b,c, etc. are then indented forming pockets along the sidewalls of trenches 1304, and inner spacers 1402 are formed within the pockets. See FIG. 14 (a cross-sectional view X). A selective lateral etch can be performed to indent the gate dielectric 1002 and sacrificial material 1102, forming the pockets. As provided above, according to an exemplary embodiment, the sacrificial material 1102 is SiGe. In that case, a SiGe-selective non-directional (isotropic) etching process can be used for the recess etch. Suitable materials for inner spacers 1402 include, but are not limited to, silicon nitride (SiN), SiOx, SiC SiCO, SiBCN and/or SiOCN. A process such as CVD, ALD or PVD can be employed to deposit the spacer material into the pockets, after which excess spacer material can be removed from the trenches 1304 using an isotropic etching process such as a wet etch.

Figure 14:
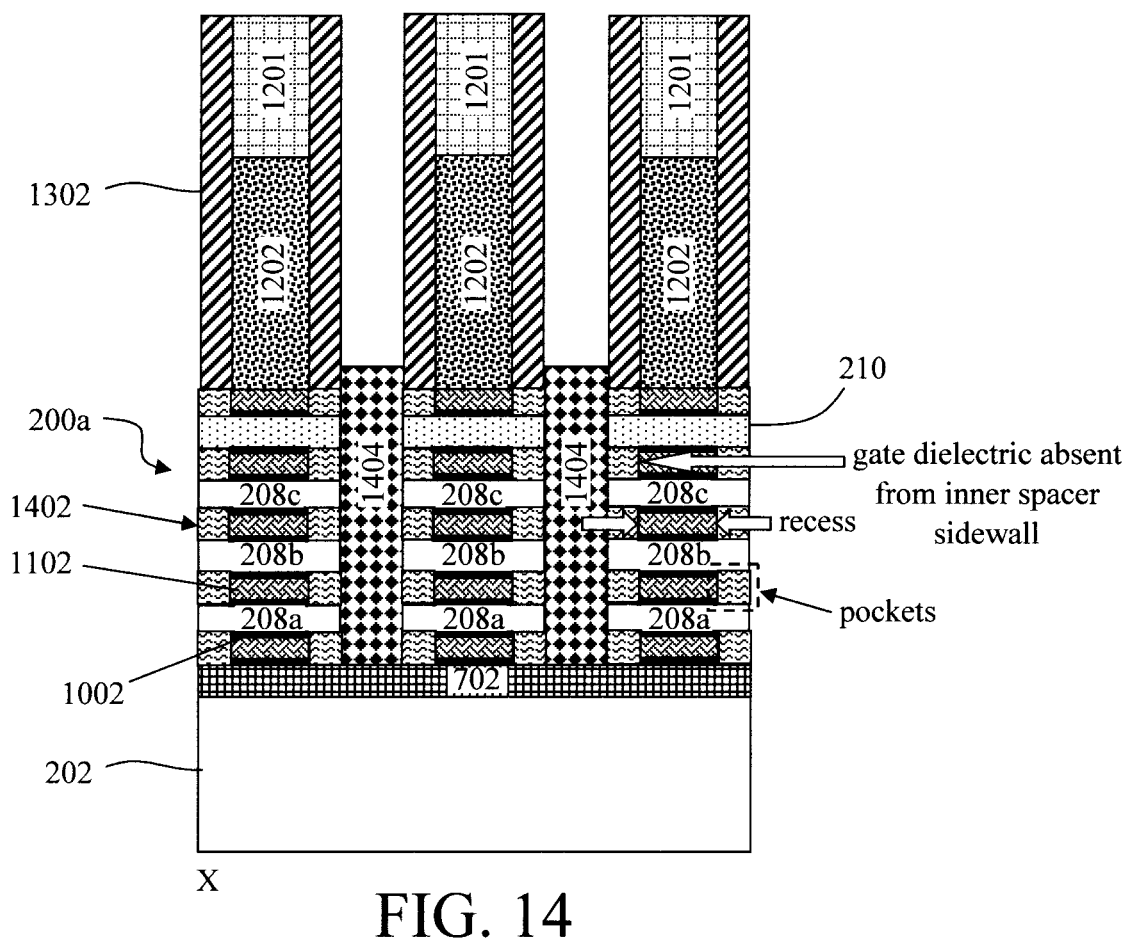
FIG. 14 is a cross-sectional diagram illustrating the gate dielectric and sacrificial material in between the active layers having been indented forming pockets along the sidewalls of the trenches, inner spacers having been formed within the pockets, and source and drains having been formed in the trenches on opposite sides of the sacrificial gates alongside the active layers from a view perpendicular to the gates according to an embodiment of the present invention.

Since the gate dielectric 1002 has already been deposited onto/lining the active layers 208a,b,c, etc. in the PFET and NFET device stacks 200a and 200b, this lateral etching of the gate dielectric 1002 and sacrificial material 1102 followed by formation of the inner spacers 1402 will result in a unique structure. Namely, as shown in FIG. 14, the gate dielectric 1002 wraps around/surrounds a portion of each of the horizontal active layers 208a,b,c, etc. (FIG. 14 depicts a cross-sectional view, however it is to be understood that the gate dielectric 1002 fully wraps around the active layers 208a,b,c, etc.). However, the gate dielectric 1002 is absent from the sidewall of the inner spacers 1402. Avoiding forming a high-κ dielectric over the inner spacers 1402 advantageously reduces the overall parasitic capacitance between the gate and the source and drain epitaxy, because this reduces the overall κ value of the inner spacer.

Source and drains 1404 are then formed in the trenches 1304 on opposite sides of the sacrificial gates 1202 alongside the active layers 208a,b,c, etc. Inner spacers 1402 serve to offset the source and drains 1404 from the replacement metal gates of the semiconductor FET device. According to an exemplary embodiment, source and drains 1404 are formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 1402 in place along the sidewalls of trenches 1304, epitaxial growth of the source and drains 1404 is templated only from the ends of the active layers 208a,b,c, etc. along the sidewalls of trenches 1304.

Figure 15A:
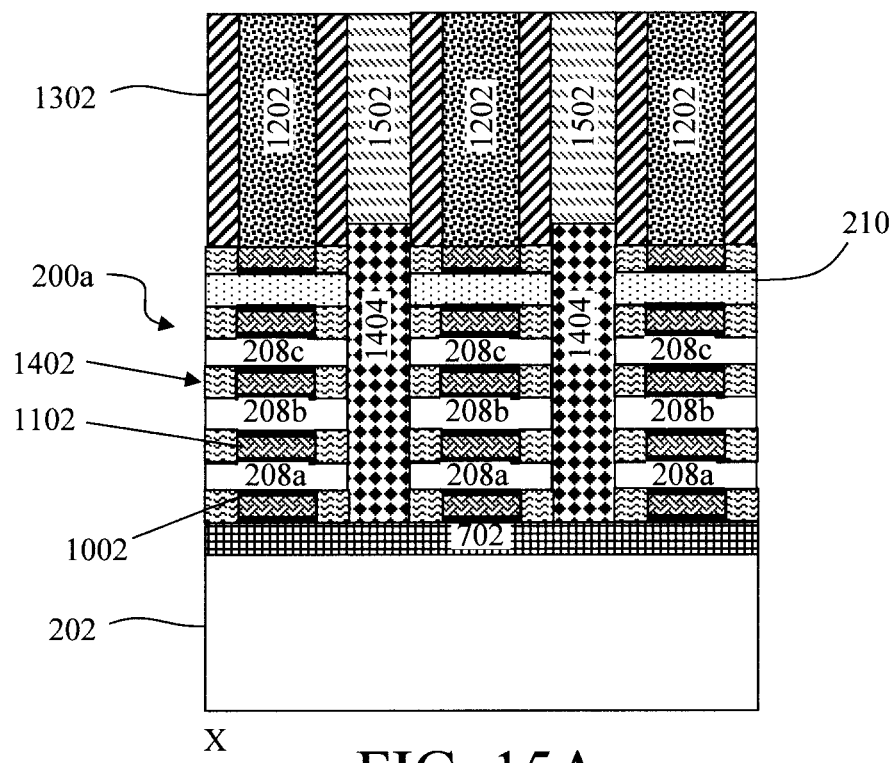
FIG. 15A is a cross-sectional diagram illustrating an interlayer dielectric (ILD) having been deposited around the sacrificial gates and dielectric spacers, followed by chemical mechanical polishing (CMP) which removes the sacrificial gate hardmasks and recesses the dielectric spacers from a view perpendicular to the gates.
Figure 15B:
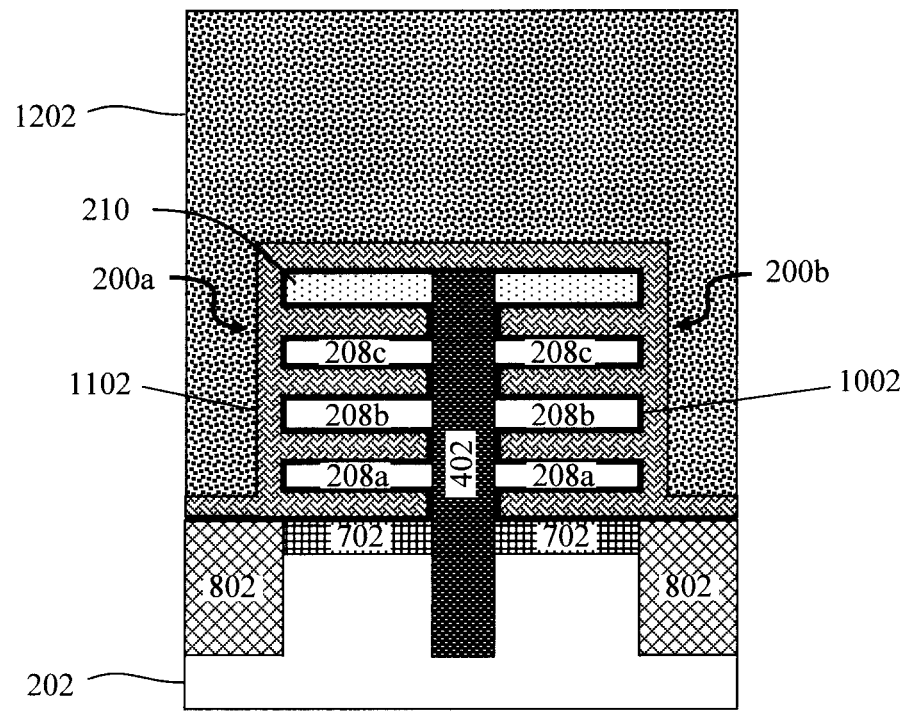
FIG. 15B is a cross-sectional diagram illustrating the sacrificial gate hardmasks having been removed from the sacrificial gates from a view through one of the gates according to an embodiment of the present invention.

An ILD 1502 is then deposited onto the semiconductor FET device structure surrounding the sacrificial gates 1202 and dielectric spacers 1302, after which a process such as CMP is used to planarize the ILD 1502. See FIG. 15A (a cross-sectional view X). Suitable ILD 1502 materials include, but are not limited to, SiOx and/or oxide ULK-ILD materials such as pSiCOH. A process such as CVD, ALD, or PVD can be used to deposit the ILD 1502. As shown in FIG. 15A, the CMP of ILD 1502 can serve to remove the sacrificial gate hardmasks 1201 and recess the dielectric spacers 1302. Removal of the sacrificial gate hardmasks 1201 exposes the underlying sacrificial gates 1202, which are removed in the next step. FIG. 15B (a cross-sectional view Y) illustrates sacrificial gate hardmasks 1201 having been removed from the sacrificial gates 1202 from another perspective, i.e., perpendicular to the PFET and NFET device stacks 200a and 200b.

Sacrificial gates 1202 are then selectively removed forming gate trenches 1602 in the ILD 1502 over the PFET and NFET device stacks 200a and 200b in between the source and drains 1404. See FIG. 16A (a cross-sectional view X).

Figure 16A:
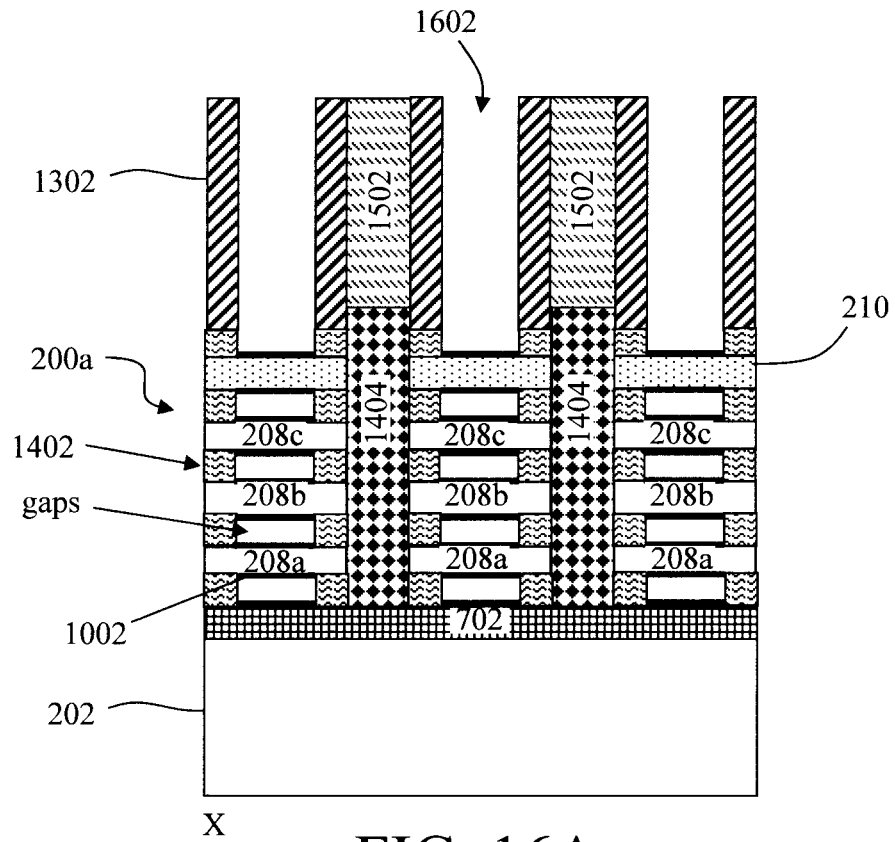
FIG. 16A is a cross-sectional diagram illustrating the sacrificial gates and the sacrificial material having been removed forming gate trenches in the ILD over the PFET and NFET device stacks and gaps in the device stacks in between the active layers from a view perpendicular to the gates.
Figure 16B:
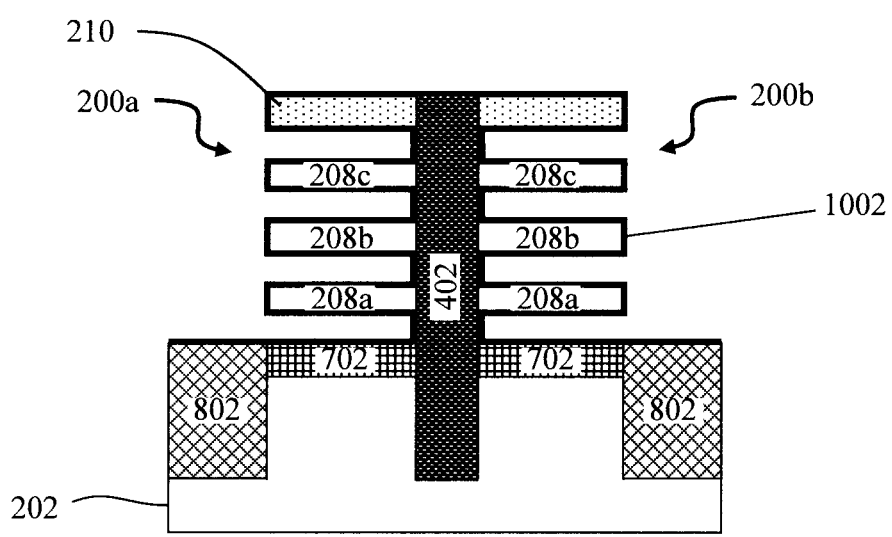
FIG. 16B is a cross-sectional diagram illustrating the sacrificial gates and the sacrificial material having been removed from a view through one of the gates according to an embodiment of the present invention.

As shown in FIG. 16A, the sacrificial material 1102 is now accessible through the gate trenches 1602, and is also removed. Removal of the sacrificial material 1102 releases the active layers 208a,b,c, etc. from the device stacks 201a,b, etc. in the channel region of the semiconductor FET device. Gaps are now present in the device stacks 201a,b, etc. in between the active layers 208a,b,c, etc. in the channel region of the semiconductor FET device. Active layers 208a,b,c, etc. will be used to form the channels of the semiconductor FET device. As will be described in detail below, replacement metal gates, i.e., including the gate dielectric 1002 and at least one workfunction-setting metal, will be formed in the gate trenches 1602 and the gaps that fully surround a portion of each of the active layers 208a,b,c, etc. in a gate-all-around (GAA) configuration. FIG. 16B (a cross-sectional view Y) illustrates sacrificial gates 1202 and sacrificial material 1102 having been removed from another perspective, i.e., perpendicular to the PFET and NFET device stacks 200a and 200b.

Figure 17A:
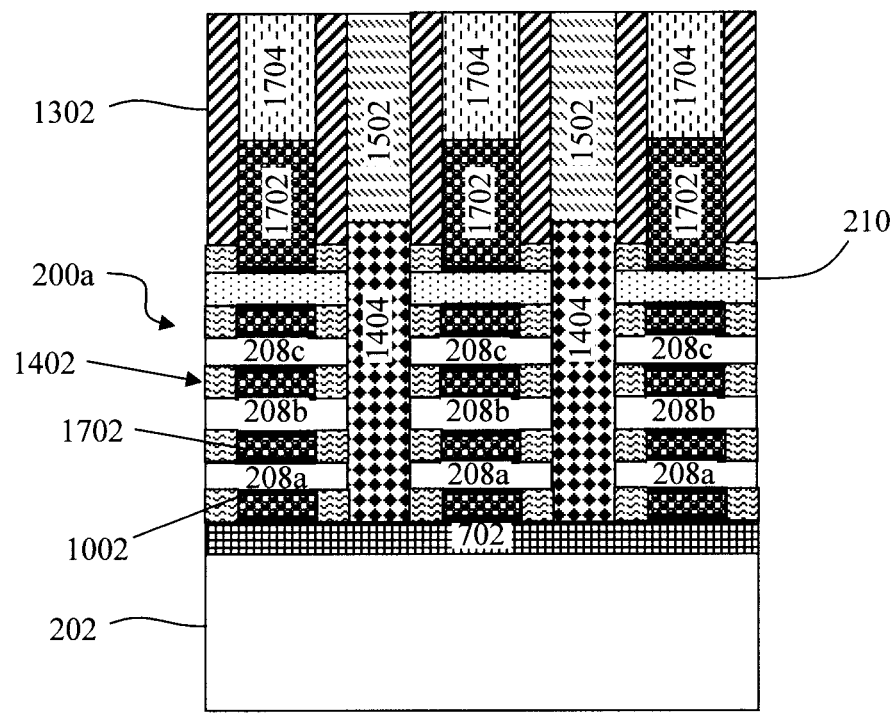
FIG. 17A is a cross-sectional diagram illustrating a workfunction-setting metal(s) having been deposited into the gate trenches and gaps over the gate dielectric, the gate dielectric and workfunction-setting metal(s) having been recessed, and dielectric caps having been formed in gate trenches over the (recessed) gate dielectric and workfunction-setting metal(s) from a view perpendicular to the gates.

To complete the replacement metal gates, at least one workfunction-setting metal 1702 is then deposited into the gate trenches 1602 and gaps over the gate dielectric 1002. See FIG. 17A (a cross-sectional view X). Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal (s) 1702, after which the metal overburden can be removed using a process such as CMP. As shown in FIG. 17A, the replacement metal gates, i.e., gate dielectric 1002 and workfunction-setting metal(s) 1702 fully surround a portion of each of the active layers 208a,b,c, etc. in a gate-all-around (GAA) configuration.

Figure 17B:
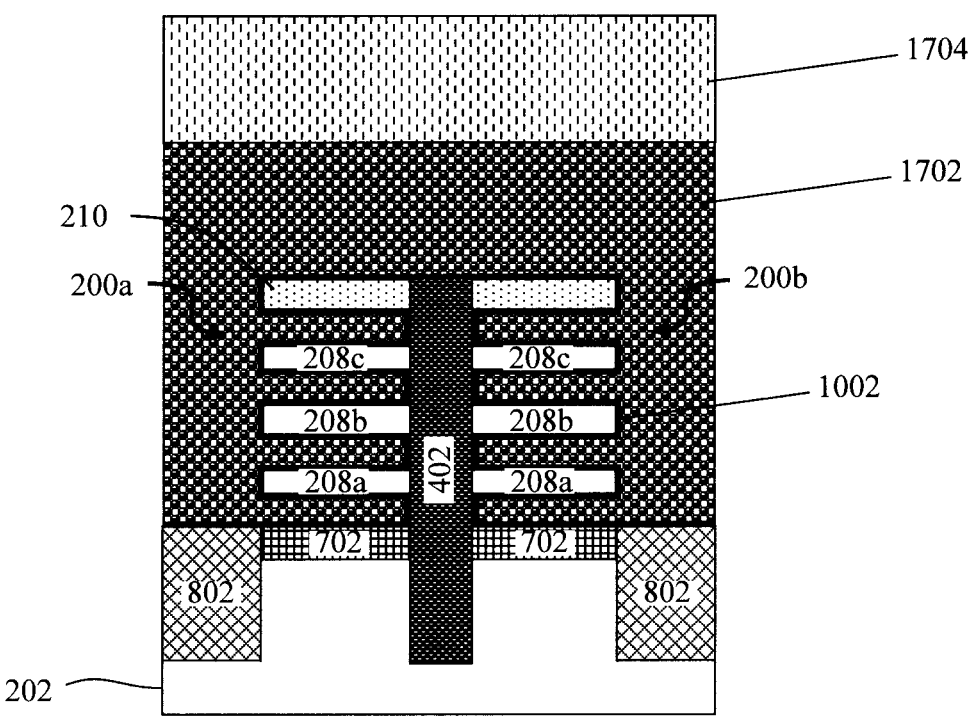
FIG. 17B is a cross-sectional diagram illustrating the workfunction-setting metal(s) having been deposited over the gate dielectric, and dielectric caps having been formed over the gate dielectric and workfunction-setting metal(s) from a view through one of the gates according to an embodiment of the present invention.

As shown in FIG. 17A, the gate dielectric 1002 and workfunction-setting metal(s) 1702 are then recessed, and dielectric caps 1704 are formed in gate trenches 1602 over the (recessed) gates, i.e., gate dielectric 1002 and workfunction-setting metal(s) 1702. Suitable materials for dielectric caps 1704 include, but are not limited to, SiOx and/or SiN. A process such as CVD, ALD or PVD can be employed to deposit the dielectric cap material into gate trenches 1602, after which the material can be planarized using a process such as CMP. FIG. 17B (a cross-sectional view Y) illustrates workfunction-setting metal(s) 1702 having been deposited over the gate dielectric 1002, and dielectric caps 1704 having been formed over the replacement metal gates (i.e., gate dielectric 1002 and workfunction-setting metal(s) 1702) from another perspective, i.e., perpendicular to the PFET and NFET device stacks 200a and 200b.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor field-effect transistor (FET) device, comprising:
    a substrate;
    at least one device stack comprising active layers oriented horizontally one on top of another on the substrate;
    a hardmask disposed on the at least one device stack;
    source and drains alongside the active layers; and
    gates, offset from the source and drains by inner spacers, surrounding a portion of each of the active layers, wherein the inner spacers are coplanar with opposite ends of the active layers providing the at least one device stack with straight sidewalls adjacent to the source and drains, and wherein the gates comprise a gate dielectric that is disposed on the hardmask and which wraps around the active layers but is absent from sidewalls of the inner spacers.

2. The semiconductor FET device of claim 1, wherein the at least one device stack comprises:
    a p-channel FET (PFET) device stack separated from an n-channel FET (NFET) device stack by an NFET-to-PFET spacer, wherein the NFET-to-PFET spacer directly contacts the active layers and the hardmask.

3. The semiconductor FET device of claim 2, wherein the NFET-to-PFET spacer comprises a material selected from the group consisting of: silicon oxide, silicon nitride, and combinations thereof.

4. The semiconductor FET device of claim 1, wherein the active layers comprise silicon.

5. The semiconductor FET device of claim 1, wherein the gates further comprise at least one workfunction-setting metal disposed on the gate dielectric.

6. The semiconductor FET device of claim 1, further comprising:
    a bottom dielectric isolation layer disposed on the substrate below the at least one device stack.

7. The semiconductor FET device of claim 1, further comprising:
    shallow trench isolation (STI) regions in the substrate at a base of the least one device stack.

8. The semiconductor FET device of claim 1, further comprising:
    gate caps disposed over the gates.

9. A semiconductor field-effect transistor (FET) device, comprising:
    a substrate;
    a p-channel FET (PFET) device stack separated from an n-channel FET (NFET) device stack by an NFET-to-PFET spacer, wherein the PFET device stack and the NFET device stack each comprises active layers oriented horizontally one on top of another on the substrate;
    source and drains alongside the active layers; and
    gates, offset from the source and drains by inner spacers, surrounding a portion of each of the active layers, wherein the inner spacers are coplanar with opposite ends of the active layers providing the PFET device stack and the NFET device stack with straight sidewalls adjacent to the source and drains, and wherein the gates comprise a gate dielectric that wraps around the active layers but is absent from sidewalls of the inner spacers, and at least one workfunction-setting metal disposed on the gate dielectric.

10. The semiconductor FET device of claim 9, further comprising:
a bottom dielectric isolation layer disposed on the substrate below the PFET device stack and the NFET device stack.

11. The semiconductor FET device of claim 9, further comprising:
shallow trench isolation (STI) regions in the substrate at a base of the PFET device stack and the NFET device stack.

12. A method of forming a semiconductor field-effect transistor (FET) device, the method comprising the steps of:
forming at least one device stack on a substrate comprising a first sacrificial layer and alternating layers of second sacrificial layers and active layers disposed on the first sacrificial layer;
removing the first sacrificial layer and replacing the first sacrificial layer with a dielectric material to form a bottom dielectric isolation layer;
selectively removing the second sacrificial layers forming gaps in the at least one device stack between the active layers;
depositing a gate dielectric into the gaps that wraps around the active layers;
depositing a sacrificial material into the gaps over the gate dielectric;
forming sacrificial gates and dielectric spacers over the at least one device stack;
forming trenches in the at least one device stack using the sacrificial gates and the dielectric spacers;
indenting the sacrificial material to form pockets along sidewalls of the trenches; and
forming inner spacers within the pockets, wherein the gate dielectric is absent from sidewalls of the inner spacers.

13. The method of claim 12, further comprising the steps of:
forming source and drains in the trenches on opposite sides of the active layers;
removing the sacrificial gates and the sacrificial material forming gate trenches over the at least one device stack and gaps in the at least one device stack in between the active layers; and
depositing at least one workfunction-setting metal into the gate trenches and the gaps over the gate dielectric.

14. The method of claim 12, further comprising the steps of:
recessing the gate dielectric and the at least one workfunction-setting metal; and
forming gate caps over the gate dielectric and the at least one workfunction- setting metal that have been recessed.

15. The method of claim 12, wherein the at least one device stack comprises a p-channel FET (PFET) device stack and an n-channel FET (NFET) device stack, the method further comprising the step of:
forming an NFET-to-PFET spacer separating the PFET device stack from the NFET device stack.

16. The method of claim 15, wherein the NFET-to-PFET spacer comprises a material selected from the group consisting of: silicon oxide, silicon nitride, and combinations thereof.

17. The method of claim 12, further comprising the step of:
forming shallow trench isolation (STI) regions in the substrate at a base of the at least one device stack after the bottom dielectric isolation layer has been formed.

18. The method of claim 12, wherein the first sacrificial layer and the second sacrificial layers each comprise silicon germanium, and wherein the active layers comprise silicon.

19. The method of claim 18, wherein the first sacrificial layer comprises silicon germanium having from about 50% germanium to about 100% germanium and ranges therebetween, and wherein the second sacrificial layers having from about 20% germanium to about 50% germanium and ranges therebetween.

20. The method of claim 12, wherein the sacrificial material comprises amorphous silicon germanium.

* * * * *